(12) United States Patent
Schnetzka et al.

(10) Patent No.: US 8,014,110 B2
(45) Date of Patent: Sep. 6, 2011

(54) VARIABLE SPEED DRIVE WITH INTEGRAL BYPASS CONTACTOR

(75) Inventors: Harold R. Schnetzka, York, PA (US); Ivan Jadric, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 724 days.

(21) Appl. No.: 11/932,054

(22) Filed: Oct. 31, 2007

(65) Prior Publication Data

US 2008/0174257 A1 Jul. 24, 2008

Related U.S. Application Data

(60) Provisional application No. 60/885,932, filed on Jan. 22, 2007.

(51) Int. Cl.
*F21V 7/04* (2006.01)
*H02H 5/04* (2006.01)
*H02H 7/08* (2006.01)

(52) U.S. Cl. .......... 361/31; 361/699; 318/434; 318/455; 318/503; 363/34

(58) Field of Classification Search .............. 361/31, 361/699; 318/434, 455, 503; 363/34
See application file for complete search history.

(56) References Cited

U.S. PATENT DOCUMENTS

| | | |
|---|---|---|
| 3,593,103 A | 7/1971 | Chandler et al. |
| 4,308,491 A | 12/1981 | Joyner, Jr. et al. |
| 4,587,474 A | 5/1986 | Espelage et al. |
| 4,758,771 A | 7/1988 | Saito et al. |
| 5,081,368 A | 1/1992 | West |
| 5,123,080 A | 6/1992 | Gillett et al. |
| 5,127,085 A | 6/1992 | Becker et al. |
| 5,298,848 A | 3/1994 | Ueda et al. |
| 5,410,230 A | 4/1995 | Bessler et al. |

(Continued)

FOREIGN PATENT DOCUMENTS

EP 0272776 A2 6/1988

(Continued)

OTHER PUBLICATIONS

Annabelle Van Zyl, Rene Spee, Alex Faveluke, and Shibashis Bhowmik; Voltange Sag Ride-Through for Adjustable-Speed Drives With Active Rectifiers; Nov./Dec. 1998; vol. 34, Issue No. 6; IEEE Transactions on Industry Applications.

(Continued)

*Primary Examiner* — Walter Benson
*Assistant Examiner* — Erick Glass
(74) *Attorney, Agent, or Firm* — McNees Wallace & Nurick LLC (57) ABSTRACT

Systems and methods for operating a variable speed drive to receive an input AC power at a fixed AC input voltage and frequency and provide an output AC power at a variable voltage and variable frequency. The variable speed drive includes a converter stage to convert the input AC voltage to a boosted DC voltage, a DC link connected to the converter stage to filter and store the boosted DC voltage from the converter stage; and an inverter stage to convert the boosted DC voltage into AC power with variable voltage and the variable frequency. An integral bypass contactor is connected in parallel with the VSD between the AC power source and the AC output power. The integral bypass contactor is arranged to bypass the VSD when the VSD output frequency and voltage are approximately equal with the AC input voltage and frequency.

23 Claims, 6 Drawing Sheets

U.S. PATENT DOCUMENTS

| | | | |
|---|---|---|---|
| 5,592,058 A | | 1/1997 | Archer et al. |
| 5,646,458 A | | 7/1997 | Bowyer et al. |
| 5,714,851 A | * | 2/1998 | Antony et al. ............. 318/148 |
| 5,747,955 A | | 5/1998 | Rotunda et al. |
| 5,796,234 A | | 8/1998 | Vrionis |
| 5,869,946 A | | 2/1999 | Carobolante |
| 5,936,855 A | | 8/1999 | Salmon |
| 5,969,966 A | | 10/1999 | Sawa et al. |
| 6,005,362 A | | 12/1999 | Enjeti et al. |
| 6,072,302 A | | 6/2000 | Underwood et al. |
| 6,118,676 A | | 9/2000 | Divan et al. |
| 6,160,722 A | | 12/2000 | Thommes et al. |
| 6,239,513 B1 | | 5/2001 | Dean et al. |
| 6,276,148 B1 | | 8/2001 | Shaw |
| 6,313,600 B1 | | 11/2001 | Hammond et al. |
| 6,348,775 B1 | | 2/2002 | Edelson et al. |
| 6,404,655 B1 | * | 6/2002 | Welches ....................... 363/41 |
| 6,487,096 B1 | | 11/2002 | Gilbreth et al. |
| 6,559,562 B1 | | 5/2003 | Rostron |
| 6,686,718 B2 | | 2/2004 | Jadric et al. |
| 6,768,284 B2 | | 7/2004 | Lee et al. |
| 6,801,019 B2 | | 10/2004 | Haydock et al. |
| 6,906,933 B2 | * | 6/2005 | Taimela ......................... 363/37 |
| 7,081,734 B1 | | 7/2006 | Jadric et al. |
| 2003/0015873 A1 | | 1/2003 | Khalizadeh et al. |
| 2003/0052544 A1 | | 3/2003 | Yamamoto et al. |
| 2005/0057210 A1 | | 3/2005 | Ueda et al. |
| 2005/0068001 A1 | | 3/2005 | Skaug et al. |
| 2006/0250105 A1 | | 11/2006 | Jadric et al. |
| 2007/0063668 A1 | | 3/2007 | Schnetzke et al. |
| 2008/0174255 A1 | * | 7/2008 | Schnetzka et al. ............. 318/12 |
| 2009/0109713 A1 | * | 4/2009 | Schnetzka et al. ............. 363/34 |

FOREIGN PATENT DOCUMENTS

| | | |
|---|---|---|
| EP | 0283954 A2 | 9/1988 |
| EP | 0422221 A1 | 11/1989 |
| EP | 1300937 A2 | 4/2003 |
| EP | 0313366 A2 | 8/2008 |
| JP | 06105563 | 9/1992 |
| JP | 05068376 | 3/1993 |
| JP | 2002176767 | 6/2002 |
| JP | 04026374 | 9/2006 |
| WO | 9314559 A1 | 7/1993 |
| WO | 9732168 A1 | 9/1997 |
| WO | 03094334 A | 11/2003 |

OTHER PUBLICATIONS

Annette Von Jouanne, Prasad N. Enjeti, and Basudeb Banerjee; Assessment of Ride-Through Alternatives for Adjustable-Speed Drives; Jul./Aug. 1999; vol. 35, Issue No. 4; IEEE Transactions on Industry Applications.

* cited by examiner

VARIABLE SPEED DRIVE WITH INTEGRAL BYPASS CONTACTOR

CROSS REFERENCES TO RELATED APPLICATIONS

This patent application claims the benefit of U.S. Provisional Patent Application No. 60/885,932, filed Jan. 22, 2007, for which priority is claimed.

BACKGROUND

The present application relates generally to variable speed drives. The application relates more specifically to an integral bypass contactor for a variable speed drive incorporating an active converter.

A variable speed drive (VSD) for heating, ventilation, air-conditioning and refrigeration (HVAC&R) applications typically includes a rectifier or converter, a DC link, and an inverter.

Typical VSD bypasses are active only when the VSD is incapable of running, e.g., in emergency situations. The bypass incorporates a minimum of two sets of three-phase contactors, one in series with the output of the inverter section and another between the incoming mains and the motor. Bypass means may be actuated via operator intervention via the drive keypad, or may have automatic switchover to the bypass mode if the VFD fails. Transfer of the motor load from VSD operation to mains operation may result in locked rotor torque being presented to the mechanical load and very high motor inrush current as the motor is started across-the-line.

What are needed are a system and/or method that satisfy one or more of these needs or provides other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to a variable speed drive system configured to receive an input AC voltage at a fixed AC input voltage and provide an output AC power at a variable voltage and variable frequency. The variable speed drive includes a converter stage connected to an AC power source providing the input AC voltage, the converter stage being configured to convert the input AC voltage to a boosted DC voltage; a DC link connected to the converter stage, the DC link being configured to filter the boosted DC voltage from the converter stage; and an inverter stage connected to the DC link, the inverter stage being configured to convert the boosted DC voltage from the DC link into the output AC power having the variable voltage and the variable frequency. An integral bypass contactor is connected in parallel with the VSD between the AC power source and the AC output power. The integral bypass contactor is arranged to bypass the VSD when the VSD output frequency and voltage are approximately equal with the AC input voltage and frequency.

Another embodiment relates to a method of operating a VSD for powering a compressor/motor in a chiller system to eliminate losses associated with the VSD at full power. The method includes the steps of monitoring a voltage of an AC input source connected to the VSD, an input frequency of the AC input source, and a distortion level of an output voltage of the VSD; initiating a transfer process in response to the AC input source voltage and frequency being approximately equal to an output voltage and frequency of the VSD, and the distortion level of the VSD output voltage being less than a predetermined distortion level; increasing the output frequency of the VSD to equal the input frequency of the AC voltage; adjusting a DC link voltage of the VSD until the output voltage of the VSD is equal to the voltage of the AC input source; enabling a current limit of the VSD; closing a bypass contactor, the bypass contactor being connected in parallel with the VSD, between the AC input source and the compressor/motor; and disabling the VSD while the VSD is operating at a frequency within a predetermined range of frequency of an AC input source.

Certain advantages of the embodiments described herein are the integral bypass Active Converter configuration may be utilized for VSD controlled systems that operate at a maximum frequency & voltage equal to the power line mains frequency supplied to the VSD. Contactor bypass eliminates the losses associated with the VSD when the system is required to operate at maximum frequency.

Alternative exemplary embodiments relate to other features and combinations of features as may be generally recited in the claims.

BRIEF DESCRIPTION OF THE FIGURES

The application will become more fully understood from the following detailed description, taken in conjunction with the accompanying figures, wherein like reference numerals refer to like elements, in which.

DETAILED DESCRIPTION OF THE EXEMPLARY EMBODIMENTS

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Figure 1A:
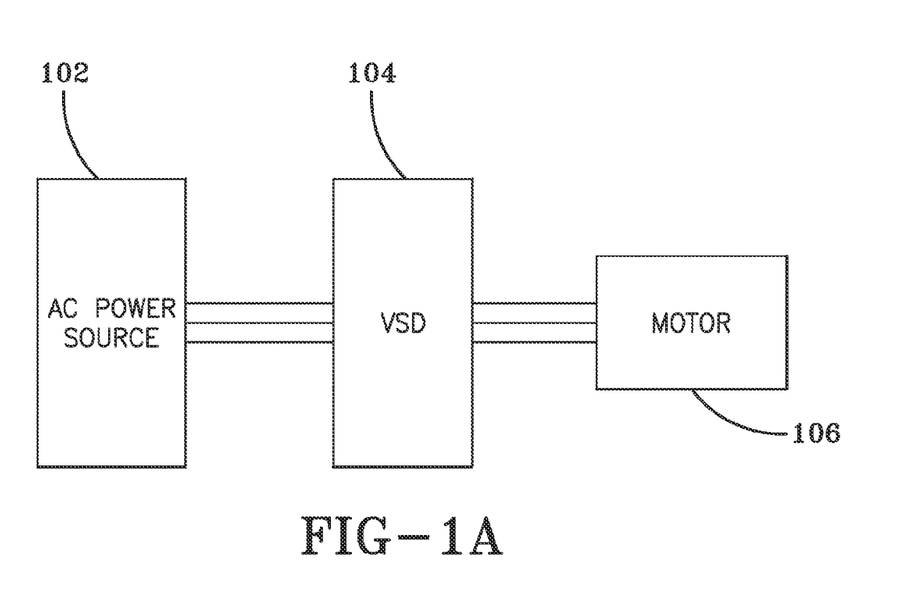
FIGS. 1A and 1B illustrate schematically a general system configuration.
Figure 1B:
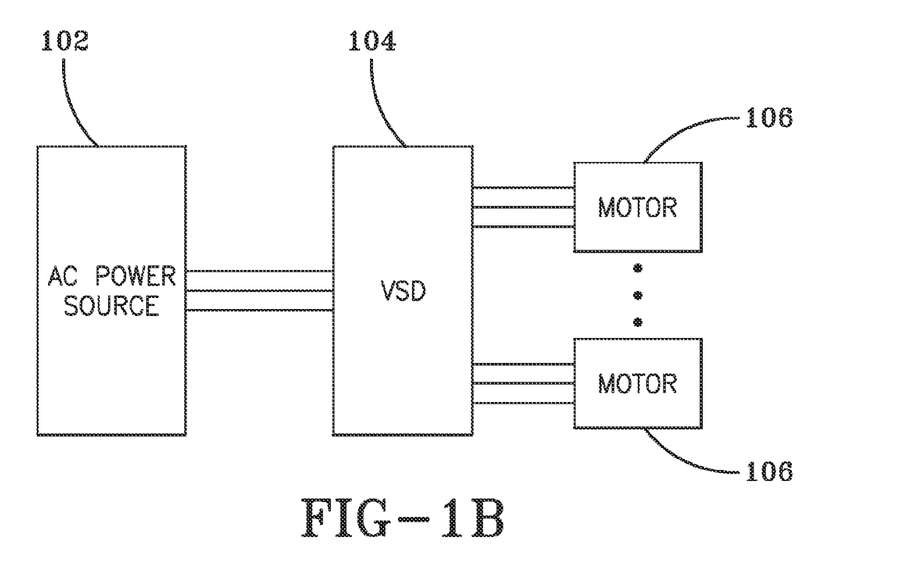

FIGS. 1A and 1B illustrate generally system configurations. An AC power source 102 supplies a variable speed drive (VSD) 104, which powers a motor 106 (see FIG. 1A) or motors 106 (see FIG. 1B). The motor(s) 106 is preferably used to drive a corresponding compressor of a refrigeration or chiller system (see generally, FIG. 3). The AC power source 102 provides single phase or multi-phase (e.g., three phase), fixed voltage, and fixed frequency AC power to the VSD 104 from an AC power grid or distribution system that is present at a site. The AC power source 102 preferably can supply an AC voltage or line voltage of 200 V, 230 V, 380 V, 460 V, or 600 V, at a line frequency of 50 Hz or 60 Hz, to the VSD 104 depending on the corresponding AC power grid.

The VSD 104 receives AC power having a particular fixed line voltage and fixed line frequency from the AC power source 102 and provides AC power to the motor(s) 106 at a desired voltage and desired frequency, both of which can be varied to satisfy particular requirements. Preferably, the VSD 104 can provide AC power to the motor(s) 106 having higher voltages and frequencies and lower voltages and frequencies than the rated voltage and frequency of the motor(s) 106. In another embodiment, the VSD 104 may again provide higher and lower frequencies but only the same or lower voltages than the rated voltage and frequency of the motor(s) 106. The motor(s) 106 is preferably an induction motor, but can include any type of motor that is capable of being operated at variable speeds. The induction motor can have any suitable pole arrangement including two poles, four poles or six poles.

Figure 2A:
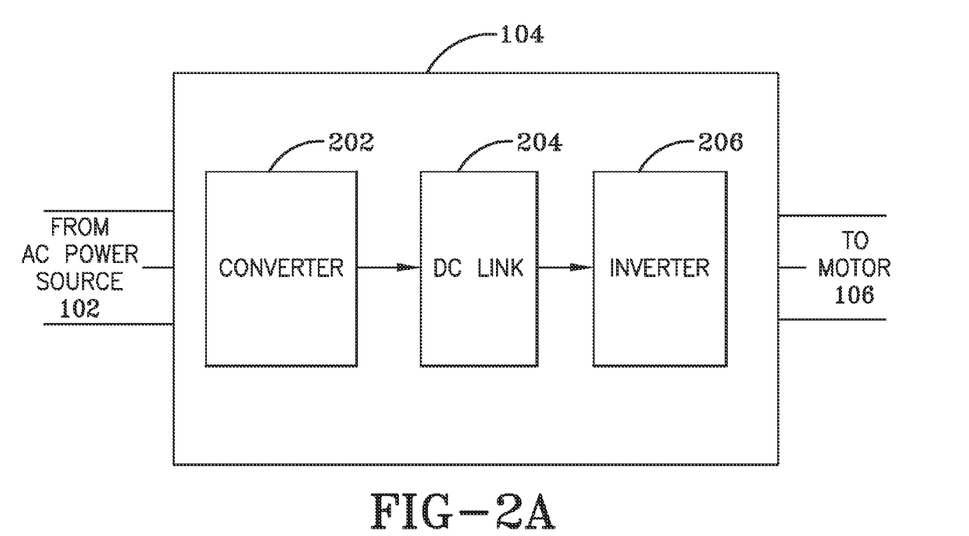
FIGS. 2A and 2B illustrate schematically embodiments of variable speed drives.
Figure 2B:
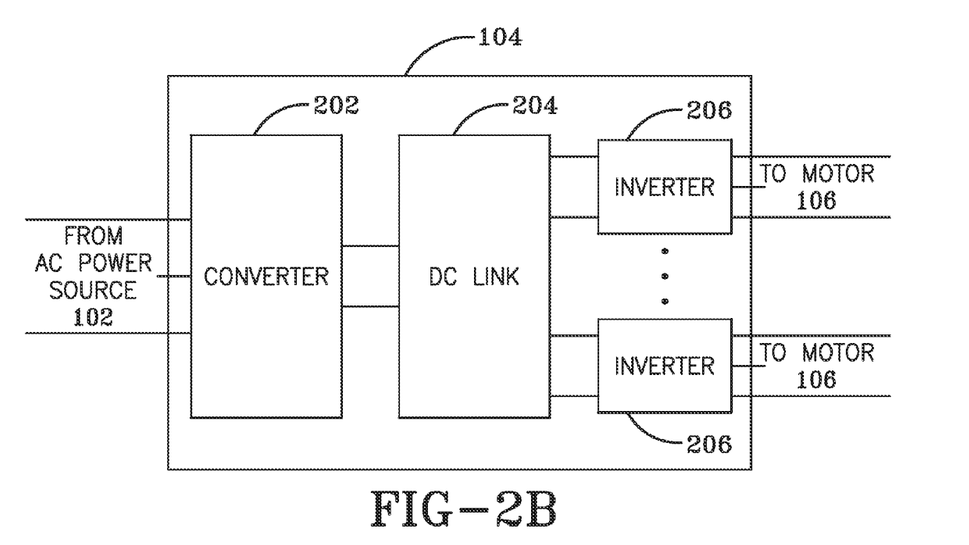

FIGS. 2A and 2B illustrate different embodiments of the VSD 104. The VSD 104 can have three stages: a converter stage 202, a DC link stage 204 and an output stage having one inverter 206 (see FIG. 2A) or a plurality of inverters 206 (see FIG. 2B). The converter 202 converts the fixed line frequency, fixed line voltage AC power from the AC power source 102 into DC power. The DC link 204 filters the DC power from the converter 202 and provides energy storage components. The DC link 204 can be composed of capacitors and inductors, which are passive devices that exhibit high reliability rates and very low failure rates. Finally, in the embodiment of FIG. 2A, the inverter 206 converts the DC power from the DC link 204 into variable frequency, variable voltage AC power for the motor 106 and, in the embodiment of FIG. 2B, the inverters 206 are connected in parallel on the DC link 204 and each inverter 206 converts the DC power from the DC link 204 into a variable frequency, variable voltage AC power for a corresponding motor 106. The inverter(s) 206 can be a power module that can include power transistors, insulated gate bipolar transistor (IGBT) power switches and inverse diodes interconnected with wire bond technology. Furthermore, it is to be understood that the DC link 204 and the inverter(s) 206 of the VSD 104 can incorporate different components from those discussed above so long as the DC link 204 and inverter(s) 206 of the VSD 104 can provide the motors 106 with appropriate output voltages and frequencies.

With regard to FIGS. 1B and 2B, the inverters 206 are jointly controlled by a control system such that each inverter 206 provides AC power at the same desired voltage and frequency to corresponding motors based on a common control signal or control instruction provided to each of the inverters 206. In another embodiment, the inverters 206 are individually controlled by a control system to permit each inverter 206 to provide AC power at different desired voltages and frequencies to corresponding motors 106 based on separate control signals or control instructions provided to each inverter 206. This capability permits the inverters 206 of the VSD 104 to more effectively satisfy motor 106 and system demands and loads independent of the requirements of other motors 106 and systems connected to other inverters 206. For example, one inverter 206 can be providing full power to a motor 106, while another inverter 206 is providing half power to another motor 106. The control of the inverters 206 in either embodiment can be by a control panel or other suitable control device.

For each motor 106 to be powered by the VSD 104, there is a corresponding inverter 206 in the output stage of the VSD 104. The number of motors 106 that can be powered by the VSD 104 is dependent upon the number of inverters 206 that are incorporated into the VSD 104. In one embodiment, there can be either 2 or 3 inverters 206 incorporated in the VSD 104 that are connected in parallel to the DC link 204 and used for powering a corresponding motor 106. While the VSD 104 can have between 2 and 3 inverters 206, it is to be understood that more than 3 inverters 206 can be used so long as the DC link 204 can provide and maintain the appropriate DC voltage to each of the inverters 206.

Figure 3:
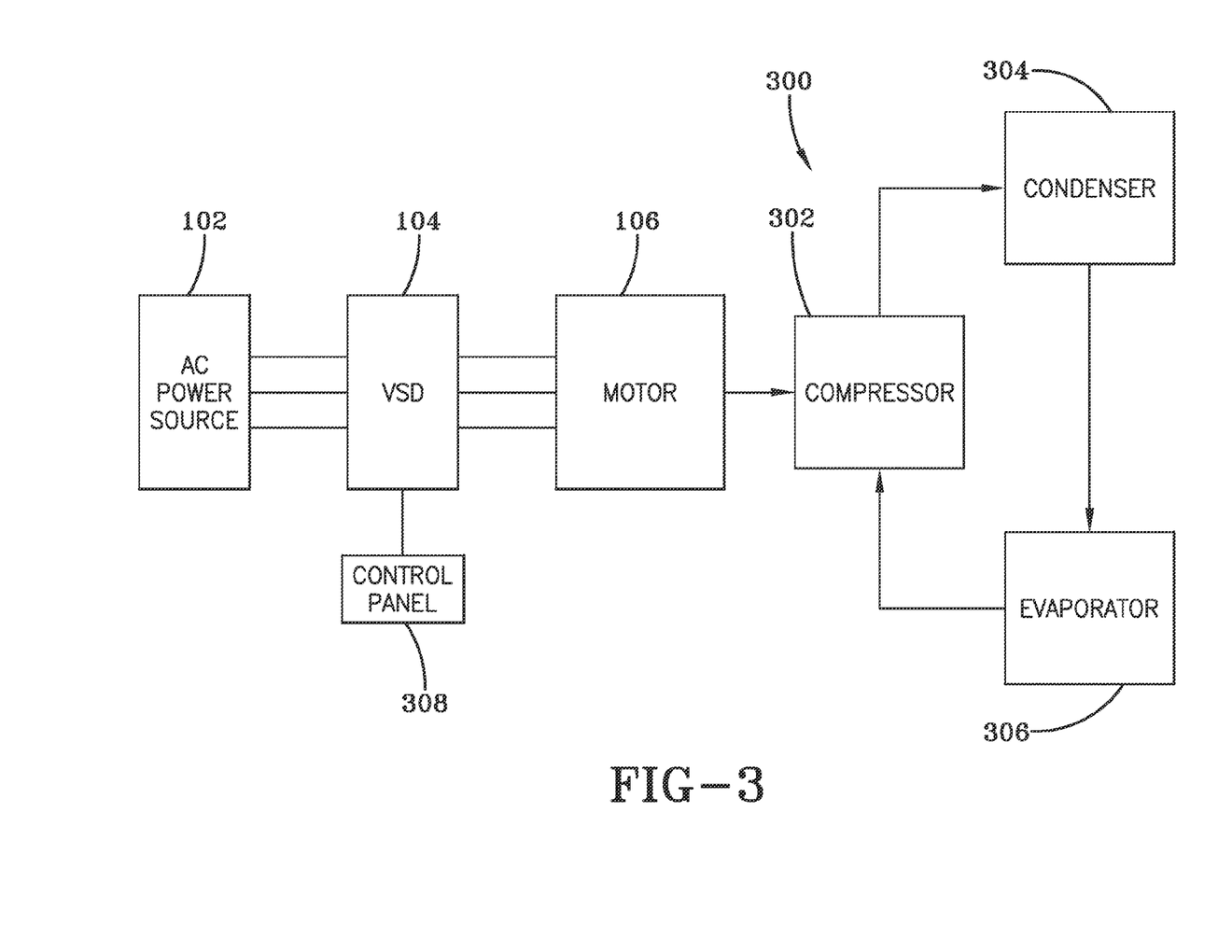
FIG. 3 illustrates schematically a refrigeration system.

FIG. 3 illustrates generally one embodiment of a refrigeration or chiller system using the system configuration and VSD 104 of FIGS. 1A and 2A. As shown in FIG. 3, the HVAC, refrigeration or liquid chiller system 300 includes a compressor 302, a condenser arrangement 304, a liquid chiller or evaporator arrangement 306 and the control panel 308. The compressor 302 is driven by motor 106 that is powered by VSD 104. The VSD 104 receives AC power having a particular fixed line voltage and fixed line frequency from AC power source 102 and provides AC power to the motor 106 at desired voltages and desired frequencies, both of which can be varied to satisfy particular requirements. The control panel 308 can include a variety of different components such as an analog to digital (A/D) converter, a microprocessor, a non-volatile memory, and an interface board, to control operation of the refrigeration system 300. The control panel 308 can also be used to control the operation of the VSD 104, and the motor 106.

Compressor 302 compresses a refrigerant vapor and delivers the vapor to the condenser 304 through a discharge line. The compressor 302 can be any suitable type of compressor, e.g., screw compressor, centrifugal compressor, reciprocating compressor, scroll compressor, etc. The refrigerant vapor delivered by the compressor 302 to the condenser 304 enters into a heat exchange relationship with a fluid, e.g., air or water, and undergoes a phase change to a refrigerant liquid as a result of the heat exchange relationship with the fluid. The condensed liquid refrigerant from condenser 304 flows through an expansion device (not shown) to the evaporator 306.

The evaporator 306 can include connections for a supply line and a return line of a cooling load. A secondary liquid, e.g., water, ethylene, calcium chloride brine or sodium chloride brine, travels into the evaporator 306 via return line and exits the evaporator 306 via supply line. The liquid refrigerant in the evaporator 306 enters into a heat exchange relationship with the secondary liquid to lower the temperature of the secondary liquid. The refrigerant liquid in the evaporator 306 undergoes a phase change to a refrigerant vapor as a result of the heat exchange relationship with the secondary liquid. The vapor refrigerant in the evaporator 306 exits the evaporator 306 and returns to the compressor 302 by a suction line to complete the cycle. It is to be understood that any suitable configuration of condenser 304 and evaporator 306 can be used in the system 300, provided that the appropriate phase change of the refrigerant in the condenser 304 and evaporator 306 is obtained.

The HVAC, refrigeration or liquid chiller system 300 can include many other features that are not shown in FIG. 3. These features have been purposely omitted to simplify the drawing for ease of illustration. Furthermore, while FIG. 3 illustrates the HVAC, refrigeration or liquid chiller system 300 as having one compressor connected in a single refrigerant circuit, it is to be understood that the system 300 can have multiple compressors, powered by a single VSD as shown in FIGS. 1B and 2B or multiple VSDs, see generally, the embodiment shown in FIGS. 1A and 2A, connected into each of one or more refrigerant circuits.

Figure 4:
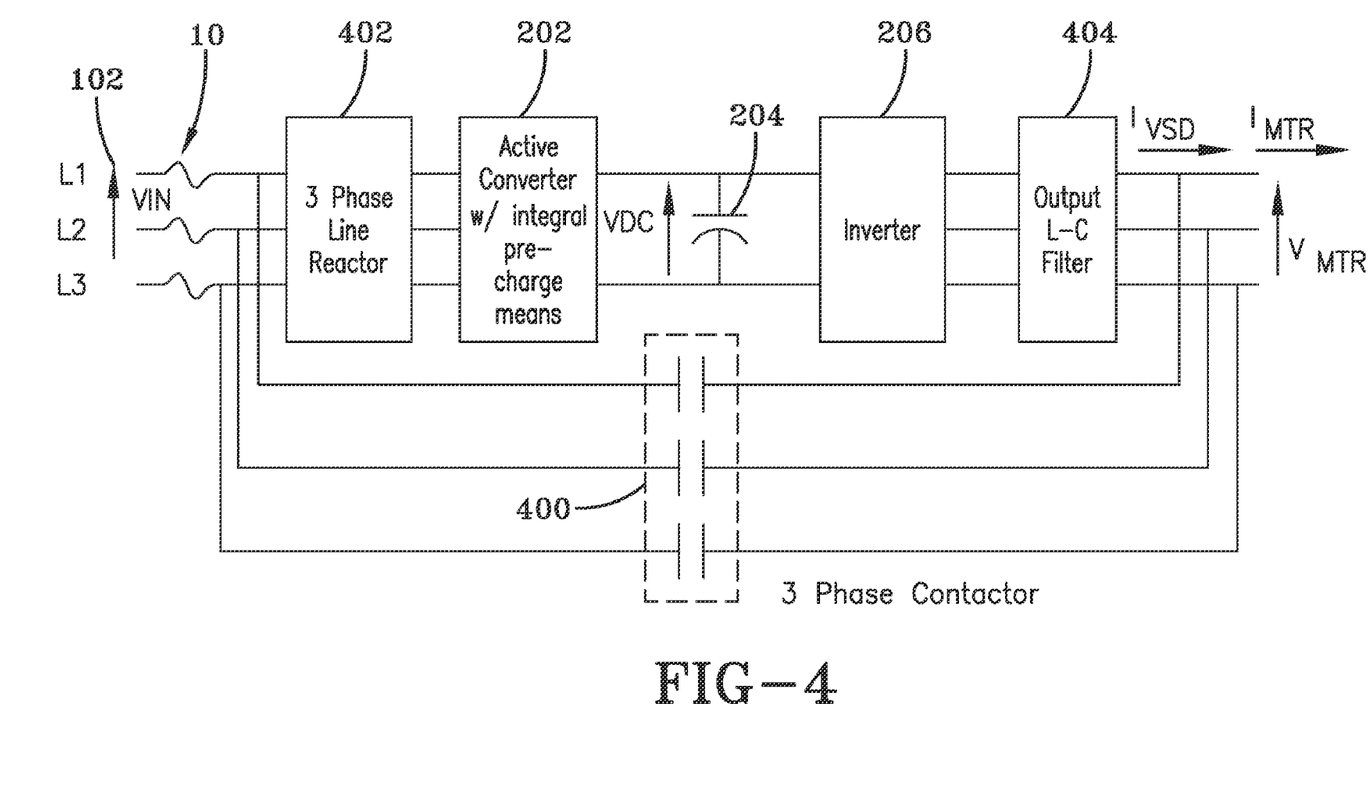
FIG. 4 is a schematic diagram of an Active Converter Topology based VSD with integral bypass contactors.

Referring next to FIG. 4, a VSD 104 includes a three-phase line reactor 402 connected to the AC voltage source 102 through protective means such as fuses 10 or a circuit breaker. The line reactor 402 enables current limiting at the input of the active converter 202 and allows for the generation of the boosted DC link voltage. An output LC filter 404 is connected to the output of the inverter 206 to filter the output waveform and attenuate electrical noise and harmonics associated with the inverter 206 output waveform. The LC filter 404 is connected in series with the inverter 206 and, e.g., the motor 106 (see, e.g., FIG. 1A). A three phase bypass contactor 400 is connected in parallel with the VSD 104, from the downstream side of the protective means 10 to the output of the LC filter 404. The use of an active converter 202 provides fast active control of the voltage at the DC link 204. The active converter 202 provides extended ride-through capability, operating capability over a universal input voltage, and the capability of programming the AC output voltage magnitude independently of the input line voltage magnitude. Using the active converter 202, the voltage at the DC link 204 is precisely and quickly controlled. Thus, the AC output voltage of the VSD 104 is also precisely and quickly controlled. A power filter 404 is connected at the output of the VSD 104 to provide sinusoidal output voltage to the motor 106. A bypass contactor 400 is incorporated within the VSD 104 to provide direct, across-the-line operation of an induction motor 106 at full speed operation of the system. The integral bypass contactor 400 can be enabled and disabled if properly applied to the VSD 104 equipped with an active converter 202. The configuration shown in FIG. 4 permits continuous operation of the VSD 104 at either 50/60 Hz mains operation or reduced frequency operation, without interrupting the operation of the chiller motor 106 and compressor 302, when switching from VSD operating mode to across-the-line operating mode. This ability to precisely control the VSD output voltage, frequency and phase of the frequency in synchronization the input voltage, phase and frequency of the AC voltage source 102 provides a smooth, transparent transfer of the electrical load, between across-the-line (i.e., full mains voltages and frequency) operation, and VSD-controlled operation, in both directions. This smooth, transparent load transfer eliminates torque excursions beyond the required torque demanded by the load. The smooth load-transfer capability eliminates driveline shock that is typically associated with transferring the power feed from VSD to mains. As a result, a reduced-size contactor may be used to transfer the load, and inrush current is eliminated, regardless of the mode in which the VSD 104 is operating.

The power loss of the VSD 104 at full-speed operation can be reduced or eliminated by bypassing the VSD 104. Normal losses associated with a conventional VSD typically range from 2 to 3%, and the losses may range as high as 4 to 5% for a VSD that employs an active converter 202. Application of the VSD 104 with the integral bypass contactor 400 for powering an HVAC chiller system provides a significant increase in the full load KW/TR rating of the chiller system. Thus the VSD 104 equipped with an integral bypass contactor 400 chiller provides an efficiency rating comparable with that of a chiller that is not equipped with a VSD 104, resulting in substantial energy savings. The energy savings and higher efficiency ratings are achievable even during periods when the full HVAC capacity is required. By utilizing a VSD 104 having an active converter 202 and integral bypass contactor 400, a contactor that may typically be used for pre-charge means in existing active converter VSDs may now applied to eliminate power losses associated with the VSD 104 during full speed operation. The system of FIG. 4 thus provides, for about the same cost, a VSD-equipped HVAC chiller system having greater full-speed KW/TR efficiency, when compared with conventional HVAC chiller systems, i.e., chiller systems having a VSD with an active converter, and without an integral bypass contactor.

Referring to FIG. 4, three input fuses 502 are included to interrupt overcurrent at the AC voltage source 102. On a per-phase basis, the parameters that must be sensed to implement the control scheme are the input voltage $V_{IN}$, the DC link voltage $V_{DC}$, the VSD 104 output current $I_{VSD}$, and the motor current $I_{MTR}$. A circuit breaker or disconnect switch (not shown) may be included at the input connection to the AC voltage source 102. The fuses 502 may be used in lieu of or in addition to a circuit breaker for overcurrent and fault protection.

To provide a smooth transition from VSD to mains or vice versa, three conditions must be present, as follows: 1) the input RMS voltage VIN to the VSD 104 must equal the RMS output voltage to the motor; 2) the input frequency of VIN must match the frequency at the output of VSD 104; and 3) the voltage distortion present at the output of the VSD 104 must be within a predetermined minimum level. The voltage distortion requirement requires that an output L-C filter 404 must be integrated into the VSD, to remove a majority of the output voltage harmonics from the VSDs output. It is also necessary that the control scheme of the VSD 104 integrate two other features as follows: 1) output current-limiting control and 2) sensorless torque control. Output current-limiting control is configured to limit the available output current at sensor $I_{VSD}$ to a predetermined limit. Sensorless induction motor torque control is configured to control the motor torque using sensed parameters $I_{MTR}$ and $V_{MTR}$. To enable the VSD 104 to lock the output voltage in both phase and frequency to the AC input source 102, the AC input source 102, or $V_{IN}$, must be detected. Finally, the voltage $V_{DC\ LINK}$ at the DC link 204 is detected and controlled to a predetermined voltage level to enable the VSD 104 to adjust the RMS motor voltage to match the voltage $V_{IN}$ at the input to the VSD 104.

The system controls are usually implemented in the system control panel 308. When the control panel 308 requires the chiller system compressor/motor 302, 106 to operate within a prescribed range below the AC voltage source frequency, the transition from VSD operation to bypass contactor operation occurs. The range may be prescribed by the plotting the efficiency of the non-VSD equipped chiller against the VSD equipped chiller using the integrated part-load value (IPLV), which is a weighted average of efficiency measurements at various part-load conditions, as described in ARI Standard 550/590-98, and incorporated herein by reference. The frequency range is generally within 1.0 Hz of the maximum frequency. For example, for a 60 Hz line, when operating at 59.0 Hz or above, more efficient operation is obtained by operating directly from the AC voltage source 102. In one embodiment the transition to the bypass contactor 400 does not occur until the chiller system is operating in steady state, i.e. the actual leaving chilled water temperature is within a predetermined band, e.g., plus or minus about 0.2° F., about the leaving chilled water temperature set point.

Figure 5:
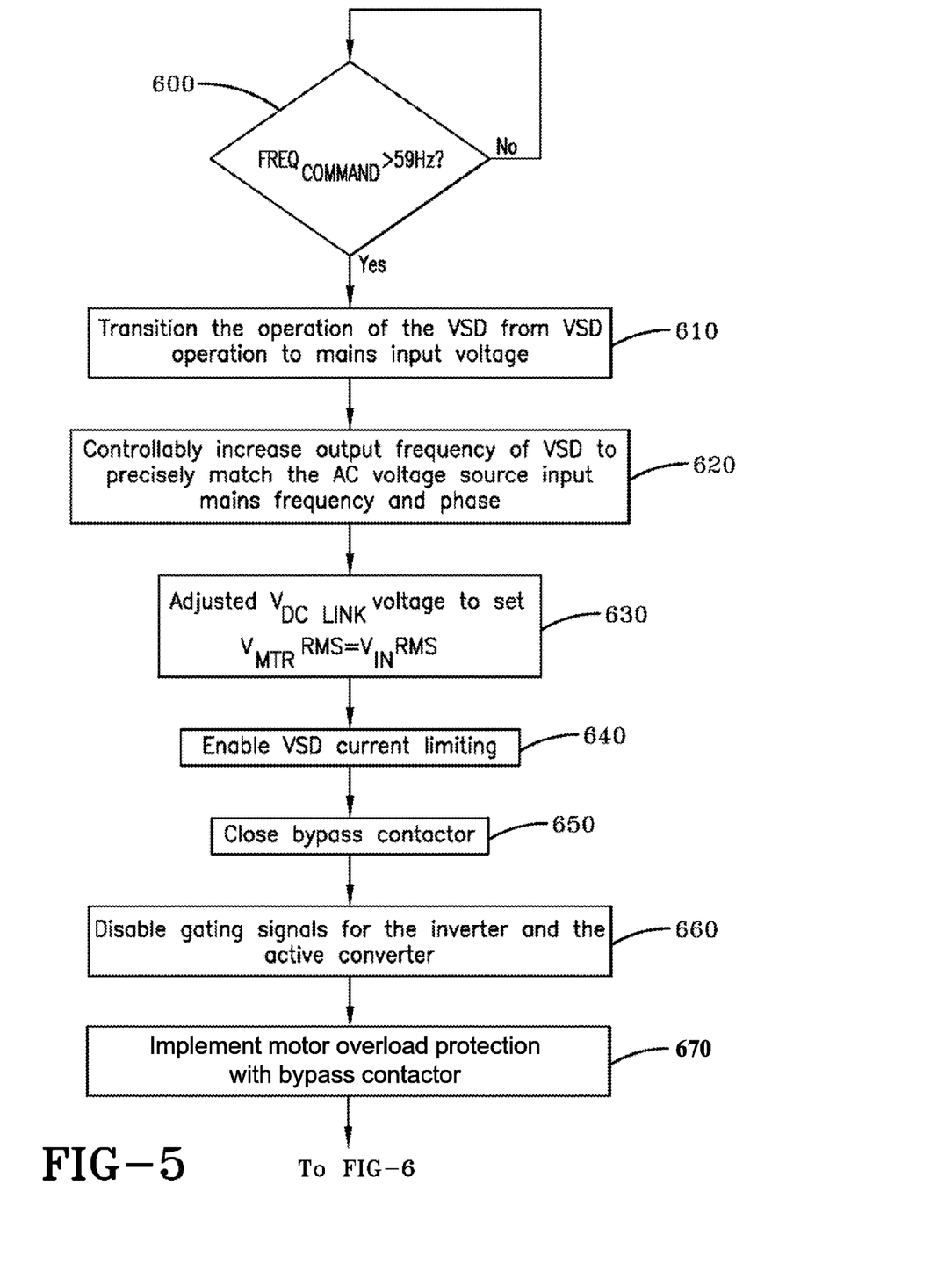
FIG. 5 is a flow control diagram of one embodiment of the VSD.

Referring to FIG. 5, control of the VSD 104 operation is described. At step 600, the control panel determines that the criteria described above for bypass contactor operation is satisfied. At step 610, a control signal is sent from the control panel 308 to transition the operation of the VSD 104 from VSD operation to full AC input voltage. At step 620, the output frequency of the VSD is controllably increased and the phase is adjusted to precisely match the AC voltage source input mains frequency and phase. At step 630 the DC link voltage is adjusted as required to match the RMS motor voltage to the RMS input mains voltage. At step 640, a current limit is enabled, and at step 650, the bypass contactor 400 is closed. At step 660 the gating signals for the inverter 206 and the active converter 202 are disabled. Although the inverter gating signals have been disabled, the DC Link voltage of the VSD remains at a level equal to approximately the peak of the input line to line mains voltage due to the inverse parallel diodes contained within the inverter section 206 of the drive. The operation of the inverse parallel diodes is set forth in greater detail in commonly owned U.S. Pat. No. 7,005,829, which is hereby incorporated by reference in its entirety. With both the inverter 206 and active converter 202 gating signals disabled, the power dissipated in the VSD 104 becomes essentially zero. At step 670, motor protection means, e.g., motor overload current sensing, etc., is now performed using the I MTR parameter and motor disconnecting means, if required, will be implemented by disengaging the bypass contactor 400. The transition method just described eliminates step changes in motor RMS voltage or motor RMS current, which in turn eliminates all torque transients and motor inrush currents caused by such step changes.

Figure 6:
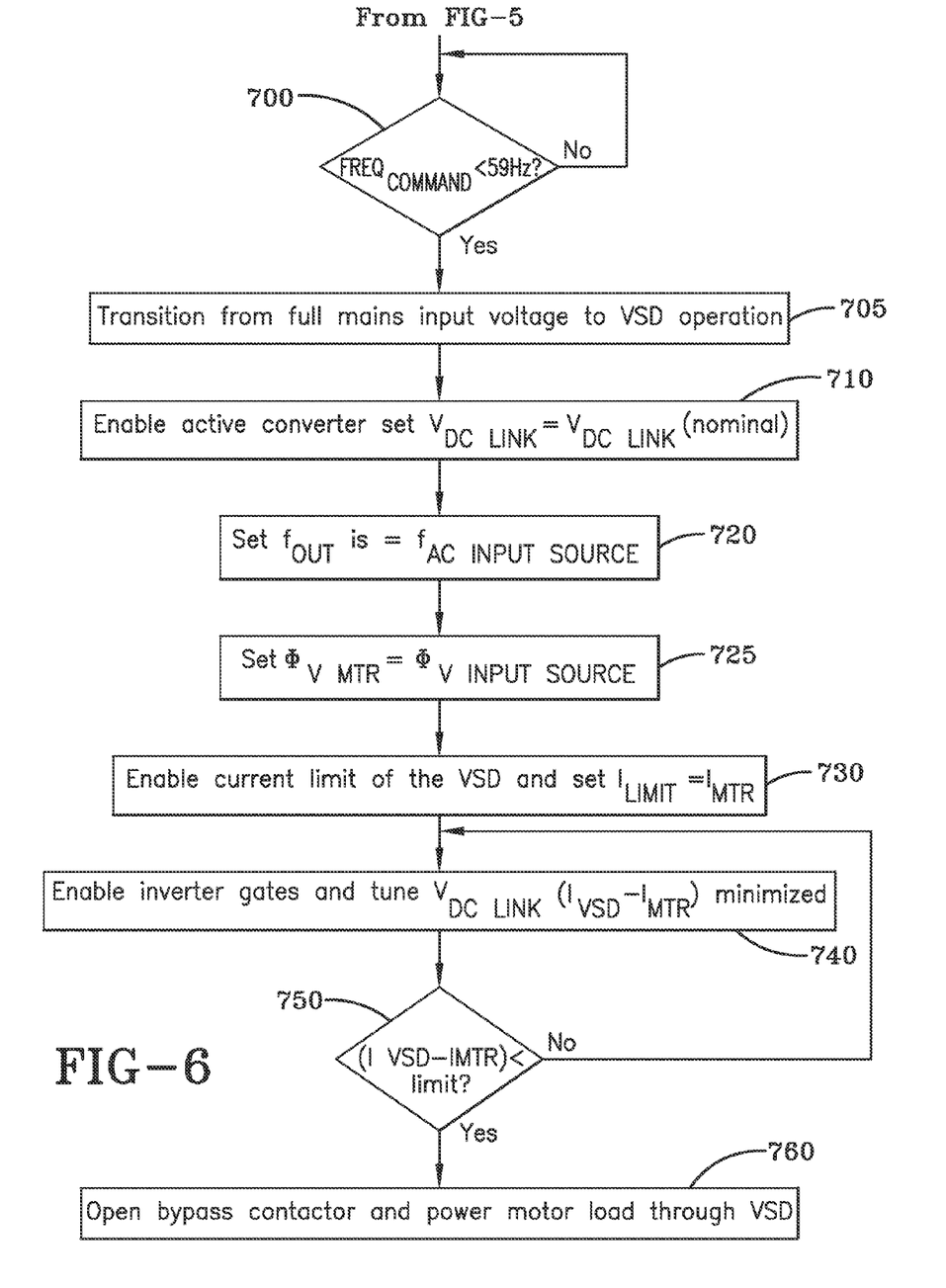
FIG. 6 is a flow control diagram of another embodiment of the VSD.

The reverse operation is set forth in FIG. 6. Transition from mains operation back to VSD operation should occur only when the system controls require the chiller system compressor/motor to operate at a frequency within a prescribed range below the frequency of the AC input source 102. In one embodiment the prescribed range is determined by the plotting the efficiency of the non-VSD-equipped compressor 302 against the VSD-equipped compressor 302 using the IPLV load line. The frequency range is generally below 1.0 Hz of the maximum frequency. When commanded to operate at 59.0 Hz or below, more efficient operation of the chiller system is obtained by operating through the VSD 104. In one embodiment, transition from bypass contactor 400 to VSD 104 may occur only when the chiller system is operating in steady state operation i.e., the actual leaving chilled water temperature is within a predetermined range (+/−0.2 F. degrees F) about the leaving chilled water temperature set point.

At step 700, the compressor/motor frequency $f_{MTR}$ is compared with the frequency of the AC input source 102, $f_{AC\ INPUT}$, and if the difference is greater than 1.0, at step 705, the control panel sends a command signal to initiate transition from full voltage of the AC input source, to VSD operation. The transition process commences at step 710 as follows. At step 710 the active converter 202 is enabled and $V_{DC\ LINK}$ is controlled to its nominal set point. At step 720 the output frequency is set to the sensed input frequency of the AC input source 102, and the phase of the output voltage $V_{MTR}$ is set to the phase of the of the AC input source 102. At step 730 the current limit of the VSD 104 is enabled and the current limit level is set to equal the current level of the parameter $I_{MTR}$. At step 740 the inverter gates are enabled and the DC link voltage is finely tuned until the difference between the VSD current and the motor current, i.e., parameter ($I_{VSD}$-$I_{MTR}$)—is minimized. At step 750, the control system determines whether the parameter ($I_{VSD}$-$I_{MTR}$) is within a prescribed limit. If so, at step 760 the bypass contactor 400 is opened and the VSD 104 powers the motor load. Otherwise, the control system returns to monitor the difference ($I_{VSD}$-$I_{MTR}$).

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the Variable Speed Drives and Methods, as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. A variable speed drive system (VSD) configured to receive an input AC voltage at a fixed AC input voltage and frequency, and provide an output AC power at a variable voltage and variable frequency, the variable speed drive comprising:
   a converter stage connected to an AC power source providing the input AC voltage, the converter stage being configured to convert the input AC voltage to a boosted DC voltage;
   a DC link connected to the converter stage, the DC link being configured to filter and store the boosted DC voltage from the converter stage;
   an inverter stage connected to the DC link, the inverter stage being configured to convert the boosted DC voltage from the DC link into the output AC power having the variable voltage and the variable frequency;
   an integral bypass contactor connected in parallel with the VSD between the AC power source and the AC output power, the integral bypass contactor configured to bypass the VSD when the VSD output frequency and voltage are approximately equal with the AC input voltage and frequency; and
   an output current limiting control and a sensorless torque control;
   the output current limiting control configured to limit the amount of output current available at the AC output power to a predetermined current value; and
   the sensorless motor torque control configured to control the motor torque based on a motor current and motor voltage.

2. The VSD of claim 1, further comprising a three-phase line reactor connected to the AC voltage source, the line reactor configured to limit an input current of the converter stage, to filter an input waveform and to attenuate electrical noise and harmonics associated with the VSD.

3. The VSD of claim 2, further comprising an output filter connected at an output of the inverter stage, the output filter configured to filter the output waveform of the VSD and to attenuate electrical noise and harmonics associated with the inverter stage.

4. The VSD of claim 3, wherein the output filter is connected in series with the inverter and the motor.

5. The VSD of claim 4, wherein the output filter is an L-C filter, the L-C filter being integrated into the VSD, and configured to remove a majority of harmonics from the AC output power.

6. The VSD of claim 1, wherein the VSD is further configured to adjust the VSD output voltage phase and frequency to equal the AC input voltage phase and frequency.

7. The VSD of claim 6, wherein the VSD is further configured to detect a DC link voltage of a DC link portion of the VSD, and to adjust the DC link voltage to a predetermined DC voltage level necessary to adjust the AC output voltage to match the AC input voltage.

8. A method of operating a VSD powering a compressor/motor in a chiller system to eliminate losses associated with the VSD at full power, the method comprising:
monitoring a voltage of an AC input source connected to the VSD, an input frequency of the AC input source, and a distortion level of an output voltage of the VSD;
initiating a transfer process in response to the AC input source voltage and frequency being equal to an output voltage and frequency of the VSD, and the distortion level of the VSD output voltage being less than a predetermined distortion level;
increasing the output frequency of the VSD to approximately equal the input frequency of the AC voltage;
adjusting a DC link voltage of the VSD until the output voltage of the VSD is approximately equal to the voltage of the AC input source;
enabling a current limit of the VSD;
closing a bypass contactor, the bypass contactor being connected in parallel with the VSD, between the AC input source and the compressor/motor; and
disabling the VSD while the VSD is operating at a frequency within a predetermined range of frequency of an AC input source.

9. The method of claim 8, wherein the predetermined distortion level is determined by the plotting an efficiency of the compressor/motor operating directly from the AC input voltage versus the compressor/motor operating from the VSD according to an IPLV load line.

10. The method of claim 8, wherein the frequency range is below 1.0 Hz of the maximum frequency.

11. The method of claim 8, wherein the step of initiating the transfer process commences after the chiller system is determined to be operating in a steady state operation.

12. The method of claim 11, wherein the steady state operation is defined as an actual leaving chilled water temperature of the chiller system within a predetermined range about a leaving chilled water temperature set point.

13. The method of claim 12, wherein the predetermined ranges is +/−0.2° F.

14. The method of claim 8, wherein the method further comprises:
monitoring an output frequency of the VSD of the compressor/motor;
detecting when the VSD is required to operate at a frequency greater than a predetermined range below a frequency of an AC input source;
sending a control signal in response to the VSD being required to operate with the predetermined range initiating transition from the AC input source to the VSD;
enabling an active converter portion of the VSD;
setting a voltage of a DC link portion of the VSD to a predetermined nominal set point;
setting the output frequency and phase of the VSD equal to the detected input frequency of the AC input source;
enabling a current limiting circuit of the VSD 104 equal to the current level of an operating current of the compressor/motor;
enabling the VSD;
determining whether a current difference between an output current of the VSD and a load current of the compressor/motor is within a predetermined range;
opening the bypass contactor in response to the current difference being within the predetermined range; and
operating the compressor/motor through the VSD.

15. The method of claim 14, further including determining, before opening the bypass contactor, that the chiller system is operating within a predetermined range about a leaving chilled water temperature set point.

16. The method of claim 15, further comprising, upon the system control panel calling for the motor to operate at a frequency less than 59.0 Hz, sending a command signal to initiate transition from the AC input source to the VSD.

17. The method of claim 16, wherein the step of disabling comprises turning off a gating signal for an inverter portion of the VSD and an active converter portion of the VSD.

18. The method of claim 17, wherein the method further comprises, following the step of disabling, performing motor protection means based on the motor load current parameter, and implementing motor disconnecting means if required by disengaging the bypass contactor.

19. A variable speed drive system (VSD) configured to receive an input AC voltage at a fixed AC input voltage and frequency, and provide an output AC power at a variable voltage and variable frequency, the variable speed drive comprising:
a converter stage connected to an AC power source providing the input AC voltage, the converter stage being configured to convert the input AC voltage to a boosted DC voltage;
a DC link connected to the converter stage, the DC link being configured to filter and store the boosted DC voltage from the converter stage;
an inverter stage connected to the DC link, the inverter stage being configured to convert the boosted DC voltage from the DC link into the output AC power having the variable voltage and the variable frequency; and
an integral bypass contactor connected in parallel with the VSD between the AC power source and the AC output power, the integral bypass contactor configured to bypass the VSD when the VSD output frequency and voltage are approximately equal with the AC input voltage and frequency;
wherein the VSD is configured to transfer a load from a VSD operation to a bypass contactor operation in response to the control panel calling for a connected load to operate at or about the frequency of the AC input voltage, wherein a range of deviation of the AC input voltage frequency is determined by plotting an efficiency of a non-VSD equipped chiller system against the chiller system equipped with the VSD using an integrated part-load value.

20. The VSD of claim 19, wherein the range of deviation of the AC input voltage frequency is within 1.0 Hz of the maximum frequency.

21. The VSD of claim 19, wherein transfer to the bypass contactor is prohibited until the chiller system is determined to be operating in a steady state condition.

22. The VSD of claim 21, wherein the steady state condition occurs when an actual leaving chilled water temperature falls within a predetermined temperature band.

23. The VSD of claim 22, wherein the predetermined temperature band is plus or minus about 0.2° F., about a leaving chilled water temperature set point.

* * * * *